(12) United States Patent
Gu et al.

(10) Patent No.: US 11,323,112 B2
(45) Date of Patent: May 3, 2022

(54) IGBT DRIVE CIRCUIT FOR MOTOR CONTROLLER, AND MOTOR CONTROLLER

(71) Applicant: JING-JIN ELECTRIC TECHNOLOGIES CO., LTD., Beijing (CN)

(72) Inventors: Dongping Gu, Beijing (CN); Fuxiang Wan, Beijing (CN); Renjun Dong, Beijing (CN)

(73) Assignee: JING-JIN ELECTRIC TECHNOLOGIES CO., LTD, Beijing (CN)

( * ) Notice: Subject to any disclaimer, the term of this patent is extended or adjusted under 35 U.S.C. 154(b) by 91 days.

(21) Appl. No.: 16/963,632

(22) PCT Filed: Mar. 1, 2019

(86) PCT No.: PCT/CN2019/076670
§ 371 (c)(1),
(2) Date: Jul. 21, 2020

(87) PCT Pub. No.: WO2019/170035
PCT Pub. Date: Sep. 12, 2019

(65) Prior Publication Data
US 2020/0350903 A1 Nov. 5, 2020

(30) Foreign Application Priority Data
Mar. 8, 2018 (CN) .......................... 201810189533.7

(51) Int. Cl.
*H02P 29/024* (2016.01)
*H03K 17/082* (2006.01)
*H03F 3/26* (2006.01)

(52) U.S. Cl.
CPC ....... *H03K 17/0828* (2013.01); *H02P 29/024* (2013.01); *H03F 3/26* (2013.01)

(58) Field of Classification Search
CPC .............. H03K 17/0828; H03K 17/691; H02P 29/024; H02P 3/12; H02P 29/0241;
(Continued)

(56) References Cited

U.S. PATENT DOCUMENTS

2012/0217906 A1* 8/2012 Hamanaka ............ B60L 3/0084
318/139
2015/0326219 A1 11/2015 Lan et al.
2015/0365003 A1* 12/2015 Sadwick ................. H02M 3/28
363/21.01

FOREIGN PATENT DOCUMENTS

CN 101834558 A 9/2010
CN 101916984 A * 12/2010
(Continued)

OTHER PUBLICATIONS

International Search Report issued in PCT/CN2019/076670 dated May 9, 2019.
(Continued)

*Primary Examiner* — Bickey Dhakal
(74) *Attorney, Agent, or Firm* — Fox Rothschild LLP; Carol E. Thorstad-Forsyth (57) ABSTRACT

The present disclosure discloses an IGBT driving circuit for an electric-motor controller and an electric-motor controller. The IGBT driving circuit includes: a function safety circuit provided on a driver board of the electric-motor controller, and a detection feedback circuit and a pulse-width-modulation (PWM) buffer circuit that are connected to the function safety circuit. The detection feedback circuit is configured to detect an IGBT module of the electric-motor controller, and when a specified malfunction of the IGBT module is detected, send a specified-malfunction signal to the function
(Continued)

safety circuit. The function safety circuit is configured to judge according to a preset malfunction treating rule and the received specified-malfunction signal, and then output a corresponding controlling signal to the PWM buffer circuit. The PWM buffer circuit is configured to generate according to the corresponding controlling signal a PWM signal that drives the IGBT module, to control ON/OFF of the IGBT module to protect the IGBT module. The technical solutions of the present application have multiple functions of protection, which improves the stability and the safety of the IGBT, and has quick action and timely protection.

14 Claims, 3 Drawing Sheets

(58) Field of Classification Search
CPC .......... H02P 29/026; H02P 29/68; H03F 3/26; H03F 2200/534; H02H 7/1225; H02H 7/205; H02H 9/043
See application file for complete search history.

(56) References Cited

FOREIGN PATENT DOCUMENTS

| | | | | | |
|---|---|---|---|---|---|
| CN | 101916984 | A | | 12/2010 | |
| CN | 203233299 | U | * | 10/2013 | |
| CN | 205178855 | U | | 4/2016 | |
| CN | 106487287 | A | | 3/2017 | |
| CN | 106655914 | A | | 5/2017 | |
| CN | 108565839 | A | | 9/2018 | |
| CN | 109687697 | A | * | 4/2019 | |
| CN | 110108997 | A | * | 8/2019 | |
| EP | 2651023 | A1 | | 10/2013 | |
| EP | 2683071 | A1 | | 1/2014 | |
| EP | 2795795 | A1 | | 10/2014 | |
| EP | 3118995 | A1 | | 1/2017 | |
| EP | 3382845 | A1 | * | 10/2018 | ............ H02J 7/0072 |
| JP | H1259754 | A | | 10/1989 | |
| JP | H1014098 | A | | 1/1998 | |
| JP | 200817650 | A | | 1/2008 | |
| JP | 2009284747 | A | | 12/2009 | |
| JP | 2012222869 | A | | 11/2012 | |
| JP | 2013165536 | A | | 8/2013 | |
| JP | 2014513912 | A | | 6/2014 | |
| JP | 2015032984 | A | * | 2/2015 | |
| JP | 2015509303 | A | | 3/2015 | |
| JP | 2015211502 | A | | 11/2015 | |
| JP | 2016127737 | A | | 7/2016 | |
| JP | 2016135072 | A | | 7/2016 | |
| JP | 2016141304 | A | | 8/2016 | |
| JP | 2017127166 | A | | 7/2017 | |
| JP | 2017158387 | A | | 9/2017 | |
| JP | 2017189008 | A | | 10/2017 | |
| WO | 2012153458 | A1 | | 11/2012 | |
| WO | 2018008333 | A1 | | 1/2018 | |
| WO | 2018030381 | A1 | | 2/2018 | |

OTHER PUBLICATIONS

European Ssearch Report issued in European patent Application No. 19764775 dated Oct. 26, 2021.
Notice of Reasons for Refusal issued in Japanese Patent Application No. 2020-531656 dated Mar. 9, 2021.
Notice of Reasons for Refusal issued in Japanese Patent Application No. 2020-531656 dated Oct. 22, 2021.

* cited by examiner

IGBT DRIVE CIRCUIT FOR MOTOR CONTROLLER, AND MOTOR CONTROLLER

CROSS-REFERENCE TO RELATED APPLICATIONS

The present application is a U.S. National Phase of International Patent Application No. PCT/CN2019/076670 which was filed on Mar. 1, 2019 and claims priority to Chinese Patent Application No. 201810189533.7 which was filed on Mar. 8, 2018. The contents of which are incorporated herein by reference in their entireties.

TECHNICAL FIELD

The present disclosure relates to the technical field of electric-motor controllers, and particularly relates to an IGBT driving circuit for an electric-motor controller, and further to an electric-motor controller.

BACKGROUND

As electric and electronic devices are extensively used in the art of cars, especially in the controlling systems, new problems in safety are continuously appearing, and hazard accidents are frequently happening. That compels big car firms to pay increasingly more attention to function safety, and prompts the International Standard Organization (ISO) to study and establish the international standard for function safety ISO 26262, which specially aims at car electric and electronic systems. The standard involves the entire car safety life cycle and its management process of car electric and electronic systems, and raises very high requirements to car and parts enterprises.

Currently, the study on the function safety design for vehicle driving-motor systems in China is rare. Electric-motor controllers are the core component for the power of the entire vehicle, and therefore, a technical solution that can improve the function safety of electric-motor controllers is urgently required.

SUMMARY

The present disclosure provides an IGBT driving circuit for an electric-motor controller and an electric-motor controller that applies the driving circuit, which can improve the function safety and the stability of the electric-motor controller, and has quick protection action.

According to an aspect of the present disclosure, there is provided an IGBT driving circuit for an electric-motor controller, wherein the IGBT driving circuit comprises: a function safety circuit provided at a driver board of the electric-motor controller, and a detection feedback circuit and a pulse-width-modulation (PWM) buffer circuit that are connected to the function safety circuit respectively;

the detection feedback circuit is configured to detect an IGBT module of the electric-motor controller, and when a specified malfunction of the IGBT module is detected, send a specified-malfunction signal to the function safety circuit;

the function safety circuit is configured to judge according to a preset malfunction treating rule and the received specified-malfunction signal, and output a corresponding controlling signal to the PWM buffer circuit; and the PWM buffer circuit is configured to generate according to the corresponding controlling signal a PWM signal that drives the IGBT module, to control ON/OFF of the IGBT module to protect the IGBT module.

Optionally, the IGBT driving circuit further comprises: an isolating driving power-supply circuit; and the isolating driving power-supply circuit is configured to receive the PWM signal outputted by the PWM buffer circuit, and isolate the PWM signal.

Optionally, the isolating driving power-supply circuit comprises: an isolating transformer and an isolating driving optical coupler;

the isolating transformer has an input end connected to a power supply of the driver board of the electric-motor controller, and an output end connected to the isolating driving optical coupler;

the isolating driving optical coupler has an input end connected to the PWM buffer circuit, and an output end connected to the IGBT module, and is configured to isolate the PWM signal and then output the PWM signal to the IGBT module; and the isolating driving optical coupler is further configured to detect a voltage between an emitter and a collector of the IGBT module, and when it is detected that the IGBT module is having a short trouble or a driving-voltage-undervoltage malfunction, feed back a short-trouble signal or a driving-voltage-undervoltage-malfunction signal to the function safety circuit.

Optionally, the detection feedback circuit comprises: a temperature detection feedback circuit, a bus-voltage detection feedback circuit and a power-supply-voltage detection feedback circuit;

the temperature detection feedback circuit is configured to detect a temperature value of the IGBT module, and when the temperature value exceeds a preset temperature threshold, determine that the IGBT module is having an over-temperature malfunction and feed back an over-temperature-malfunction signal to the function safety circuit, to cause the function safety circuit to control to shut off the IGBT module;

the bus-voltage detection feedback circuit is configured to detect a bus-voltage value of the IGBT module, and when it is determined that a bus-voltage-overvoltage malfunction happens, feed back a bus-voltage-overvoltage-malfunction signal to the function safety circuit, to cause the function safety circuit to control to shut off the IGBT module; and the power-supply-voltage detection feedback circuit is configured to detect a voltage value of a power supply of the driver board of the electric-motor controller, and when it is determined that a power-supply-voltage-undervoltage malfunction happens, feed back a power-supply-voltage-undervoltage-malfunction signal to the function safety circuit, to cause the function safety circuit to control to shut off the IGBT module.

Optionally, the function safety circuit is configured to receive an actively short-circuiting signal from a control board of the electric-motor controller, and control according to the actively short-circuiting signal the PWM buffer circuit to generate a PWM signal, to control to shut off the IGBT module.

Optionally, the function safety circuit is configured to receive a PWM enabling signal from a control board of the electric-motor controller, and according to the PWM enabling signal, cause the PWM buffer circuit to or not to output a PWM signal.

Optionally, the IGBT driving circuit further comprises: a redundant buffer circuit; and the redundant buffer circuit is configured to receive various malfunction signals that are generated when the IGBT module is having malfunctions, buffer the received malfunction signals, and then send them to a control board of the electric-motor controller, for the control board of the electric-motor controller to make judgement.

Optionally, the IGBT driving circuit further comprises: a push-pull amplifier circuit; and the push-pull amplifier circuit is connected to the isolating driving power-supply circuit and the IGBT module, and is configured to amplify the received PWM signal and then output it to the IGBT module.

Optionally, the isolating driving optical coupler has a flyback controller; and the power supply of the driver board of the electric-motor controller is a Sepic power supply that outputs a 15V voltage.

According to another aspect of the present disclosure, there is provided an electric-motor controller, wherein the electric-motor controller comprises the IGBT driving circuit for an electric-motor controller according to the above aspect of the present disclosure.

The advantageous effects of the present disclosure are as follows. The IGBT driving circuit for an electric-motor controller of the present disclosure, by the function safety circuit provided on the driver board of the electric-motor controller, collects and performs logical processing to the IGBT malfunction signals, and outputs the signals to control the PWM buffer circuit to complete multiple functions of protection to the IGBT module and the electric-motor controller, so that the electric-motor controller can provide complete protection to the IGBT. The solution that utilizes the hardware logic circuit on the driver board to process the malfunction signals and perform the relevant actions to protect the IGBT module, as compared with software, greatly shortens the protection time, thereby providing timely protection and quick action. The electric-motor controller that applies the IGBT driving circuit can improve the overall usability and safety of the electric-motor controller.

DETAILED DESCRIPTION

An electric-motor controller, as the core component for the power of the entire vehicle, is formed by multiple parts, among which the driving circuit is a critical part, and is a key of the safety design of the system function of vehicle driving motors. The embodiments of the present application provide an IGBT driving circuit for an electric-motor controller, so as to quickly ensure the safety of the IGBT module and the electric-motor controller when it is detected that the IGBT module is having a malfunction.

Figure 1:
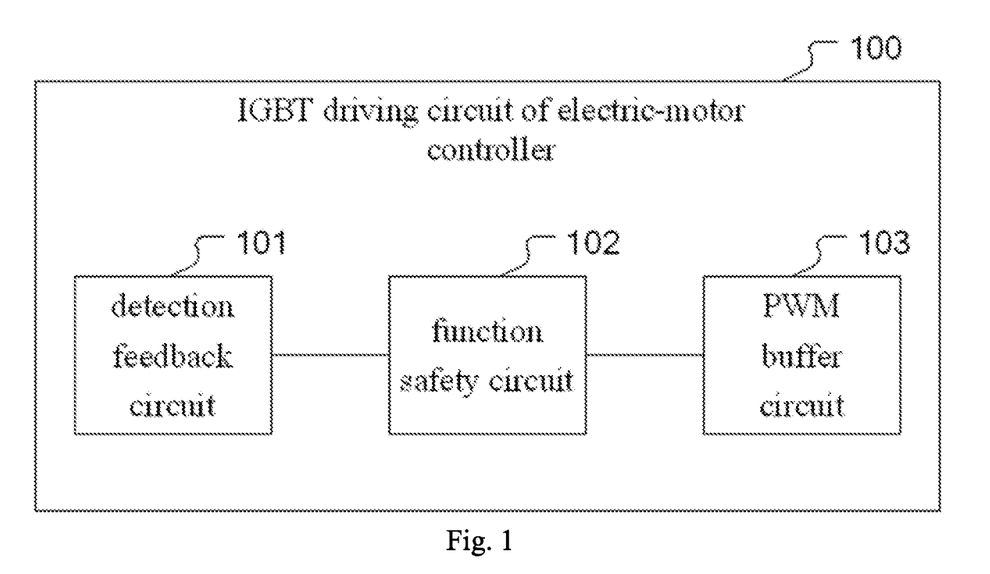
FIG. 1 is a block diagram of the IGBT driving circuit of an electric-motor controller of an embodiment of the present disclosure.

FIG. 1 is a block diagram of the IGBT driving circuit of an electric-motor controller of an embodiment of the present disclosure. Referring to FIG. 1, the IGBT driving circuit of an electric-motor controller of the embodiment of the present disclosure comprises: a function safety circuit 102 provided on a driver board of the electric-motor controller, and a detection feedback circuit 101 and a pulse-width-modulation (PWM) buffer circuit 103 that are connected to the function safety circuit 102 respectively;

the detection feedback circuit 101 is configured to detect an IGBT module of the electric-motor controller, and when a specified malfunction of the IGBT module is detected, send a specified-malfunction signal to the function safety circuit 102; wherein the specified-malfunction signal includes a short trouble, an over-temperature malfunction, a bus-voltage-overvoltage malfunction or a driving-voltage-undervoltage malfunction;

the function safety circuit 102 is configured to judge according to a preset malfunction treating rule and the received specified-malfunction signal, and output a corresponding controlling signal to the PWM buffer circuit 103; and the PWM buffer circuit 103 is configured to generate according to the corresponding controlling signal a PWM signal that drives the IGBT module, to control ON/OFF of the IGBT module to protect the IGBT module. The PWM buffer circuit outputs the PWM driving signal, to directly drive the IGBT module. The IGBT refers to Insulated Gate Bipolar Transistor.

The IGBT driving circuit of an electric-motor controller of the embodiment of the present disclosure is provided with the function safety circuit. The function safety circuit collects and performs logical processing to the IGBT malfunction signals, and outputs the signals to control the PWM buffer circuit to realize multiple functions of protection to the IGBT module and the electric-motor controller, which improves the safety of the electric-motor controller, and satisfies the practical demands. Furthermore, as compared with the solution of realizing the functions of protection by software control, experimentation proves that the IGBT driving circuit of an electric-motor controller of the present embodiment can reduce the malfunction response and treatment time from tens of microseconds to less than 1 microsecond.

In practical applications, the function safety circuit and the PWM buffer circuit may be implemented by using CPLD (Complex Programmable Logic Device) or DSP (Digital Signal Processing) or CPU. Further, the CPLD or DSP or CPU may communicate with the CPU on the control board of the electric-motor controller via an UART (Universal Asynchronous Receiver/Transmitter) interface, to improve the overall usability and safety of the electric-motor controller. Universal Asynchronous Receiver/Transmitter, generally referred to as UART, is an asynchronous receiver/transmitter, and it converts the data to be transmitted between serial communication and parallel communication.

Figure 2:
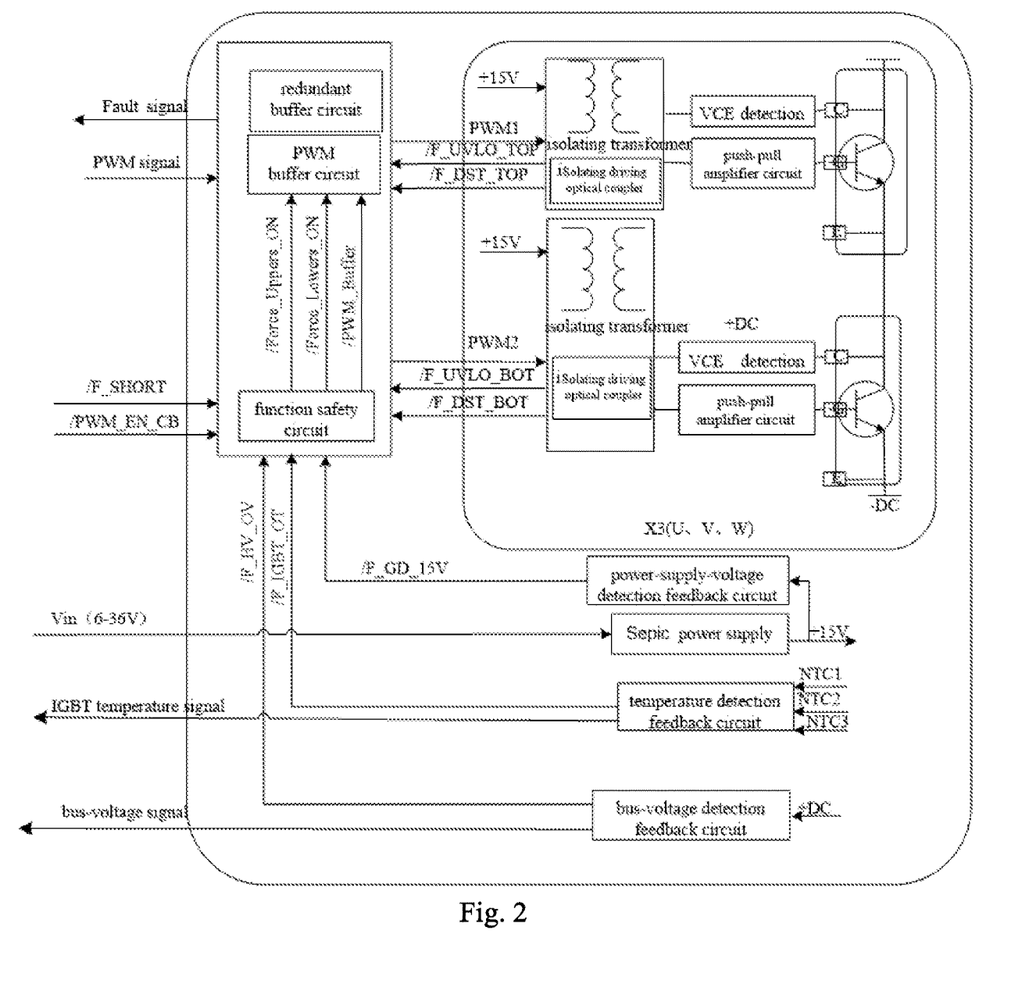
FIG. 2 is a logic diagram of the IGBT driving circuit of an electric-motor controller of an embodiment of the present disclosure.

FIG. 2 is a logic diagram of the IGBT driving circuit of an electric-motor controller of an embodiment of the present disclosure. Referring to FIG. 2, the IGBT driving circuit of an electric-motor controller comprises a detection feedback circuit, a function safety circuit, a PWM buffer circuit and an isolating driving power-supply circuit; and the isolating driving power-supply circuit is configured to receive the PWM signal outputted by the PWM buffer circuit (i.e., the PWM1 or PWM2 in FIG. 2), and isolate the PWM signal.

Referring to FIG. 2, the isolating driving power-supply circuit comprises: an isolating transformer and an isolating driving optical coupler, the isolating transformer has an input end connected to a power supply of the driver board of the electric-motor controller, and an output end connected to the isolating driving optical coupler. By detecting the power-supply voltage, the value of the primary voltage of the isolating transformer can be obtained, and whether a driving-voltage primary-undervoltage malfunction happens can be determined.

It should be noted that FIG. 2 illustrates an upper switching tube and a lower switching tube, and the two switching tubes represent one IGBT half-bridge circuit. Generally, the electric-motor controller requires three IGBT half-bridge circuits to form one three-phase full-bridge unit. In FIG. 2 the driving circuit merely describes part of the half-bridge IGBT, and the X3 (U, V, W) illustrates a three-phase IGBT module.

The isolating driving optical coupler is connected to the PWM buffer circuit, the isolating transformer and the IGBT module. Particularly, the isolating driving optical coupler has an input end connected to the PWM buffer circuit, and an output end connected to the IGBT module, to isolate the PWM signal and then output the PWM signal to the IGBT module; and the isolating driving optical coupler is further configured to detect a voltage between an emitter and a collector of the IGBT module, and when it is detected that the IGBT module is having a short trouble or a driving-voltage-undervoltage malfunction, feed back a short-trouble signal or a driving-voltage-undervoltage-malfunction signal to the function safety circuit.

In other words, the isolating driving optical coupler detects critical malfunction signals by VCE, for example, an IGBT short-trouble signal (F_DST_TOP or F_DST_BOT) and an isolating-transformer secondary-undervoltage malfunction signal (F_UVLO_TOP/F_UVLO_BOT), wherein the TOP and the BOT respectively represent the upper switching tube and the lower switching tube. After a short trouble has happened, a tremendous amount of electric current is generated instantaneously, which damages the IGBT very quickly, and the overcurrent protection of the control board cannot timely function. In the present embodiment, the hardware circuit controls the driving circuit (i.e., the PWM buffer circuit) to instantaneously provide protection, which ensures the timeliness of the malfunction treatment.

During short circuit the electric current of the IGBT module sharply rises, and when it reaches a certain numerical value, desaturation appears. When the IGBT module has overcurrent to the extent of desaturation, if the IGBT module is quickly shut off (therefore the electric current falls too sharply), the voltage spike between the collector and the emitter (CE voltage spike for short), when the IGBT module is being shut off, exceeds the rated voltage, which results in that the operating point of the CE voltage and electric current of the IGBT module goes beyond its safety operation area and the IGBT module is damaged. By the VCE detection, it can be determined whether the IGBT module has a short trouble.

The isolating driving optical coupler of the present embodiment has a flyback controller. The employment of the driving optical coupler with a flyback controller simplifies the design of the isolating driving power supply, and reduces the size and volume of the driver board. The power supply of the driver board of the electric-motor controller is a Sepic power supply that outputs a 15V voltage. The Sepic power supply is connected to the input end of the isolating transformer, and supplies power to the IGBT module.

Referring to FIG. 2, the detection feedback circuit of the present embodiment comprises: a temperature detection feedback circuit, a bus-voltage detection feedback circuit and a power-supply-voltage detection feedback circuit.

The temperature detection feedback circuit as shown in FIG. 2 is connected to three output signal lines, i.e., NTC1, NTC2 and NTC3, which are connected to the corresponding switching tubes of the three-phase IGBT module, to detect a temperature value of the IGBT module, and when the temperature value exceeds a preset temperature threshold, determine that the IGBT module is having an over-temperature malfunction and feed back an over-temperature-malfunction signal (/F_IGBT_OT) to the function safety circuit, to cause the function safety circuit to control to shut off the IGBT module. In practical applications, the function safety circuit may, according to the correspondence relation between the preset temperature malfunction treating rule and the controlling signals, output the corresponding controlling signals (for example, Force_Upper_ON, Force_Lower_ON and PWM_Buffer) to the PWM buffer circuit, to control the PWM pulse by controlling the PWM buffer circuit, to realize the operations of the three-phase bridge IGBT module such as full opening of the three upper switching tubes, full opening of the three lower switching tubes, complete shutting off of the IGBT tubes and normal ON/OFF of the IGBT tubes.

The bus-voltage detection feedback circuit is configured to detect a bus-voltage value of the IGBT module, and when it is determined that a bus-voltage-overvoltage malfunction happens (for example, the current value of the bus voltage exceeds a preset bus-voltage threshold), feed back a bus-voltage-overvoltage-malfunction signal (F_HV_OV) to the function safety circuit, to cause the function safety circuit to control to shut off the IGBT module.

The power-supply-voltage detection feedback circuit is configured to detect a voltage value of the power supply (see the Sepic power supply in FIG. 2) of the driver board of the electric-motor controller, and when it is determined that a power-supply-voltage-undervoltage malfunction happens (for example, the current value of the power-supply voltage is lower than a preset bus-voltage threshold), feed back a power-supply-voltage-undervoltage-malfunction signal (F_GD_15V) to the function safety circuit, to cause the function safety circuit to control to shut off the IGBT module.

In an embodiment of the present disclosure, the function safety circuit can not only according to the received short-trouble signal control the IGBT module to turn off and protect the IGBT module, but also receive an actively short-circuiting signal (/F_SHORT) from a control board of the electric-motor controller, and control according to the actively short-circuiting signal the PWM buffer circuit to generate a PWM signal, to control ON/OFF of the corresponding switching tube of the IGBT module, to realize the actively discharging function. It should be noted that the actively short-circuiting function is generally implemented by the control board directly sending a PWM signal to short-circuit the upper switching tube or the lower switching tube of the IGBT module. In the present embodiment, the control board may directly send a PWM signal to realize the electric-motor short-circuiting function, and the control board may also use a /F_SHORT signal to cause the function security logic circuit of the driver board to realize the electric-motor short-circuiting function, which realizes redundancy.

Further, the function safety circuit is further configured to receive a PWM enabling signal from a control board of the electric-motor controller, and according to the PWM enabling signal, cause the PWM buffer circuit to or not to output a PWM signal. Referring to FIG. 2, the /PWM_EN_CB signal is from the control board, and the signal is one of the input signals of the function safety circuit. When the /PWM_EN_CB is valid and no other malfunction signal is inputted, the driver board enables the PWM signal to be outputted. When the /PWM_EN_CB is invalid, no matter whether a malfunction signal is inputted to the function safety circuit, the function safety circuit of the driver board causes the PWM signal not to be outputted.

Referring to FIG. 2, the IGBT driving circuit of an electric-motor controller further comprises: a redundant buffer circuit configured to receive various malfunction signals that are generated when the IGBT module is having malfunctions, buffer the received malfunction signals, and then send them to a control board of the electric-motor controller, for the control board of the electric-motor controller to make judgement. The function of the redundant buffer circuit is merely to buffer the received malfunction signals and then send them to the control board.

That means that the malfunction signals pass through two paths, respectively to be inputted to the function safety circuit of the driver board to make judgement, and to the control board through the redundant buffer circuit to make judgement. Redundancy is provided again, which ensures the function safety of the electric-motor controller.

Referring to FIG. 2, the IGBT driving circuit of an electric-motor controller further comprises: a push-pull amplifier circuit connected to the isolating driving power-supply circuit and the IGBT module, and is configured to amplify the received PWM signal and output it to the IGBT module.

The IGBT driving circuit of an electric-motor controller shown in FIG. 2 is based on function safety design. The isolating driving optical coupler has a driving-voltage secondary undervoltage /F_UVLO_X and a short-trouble signal feedback /F_DST_X, wherein the X represents one of the upper switching tube TOP and the lower switching tube BOT. For example, F_UVLO_TOP represents the secondary-undervoltage malfunction signal of the isolating transformer that is connected to the upper switching tube. The bus-voltage detection feedback circuit has a bus-voltage-overvoltage signal feedback /F_HV_OV. The power-supply-voltage detection feedback circuit has a +15V undervoltage signal feedback /F_GD_15V. The temperature detection feedback circuit has an IGBT-temperature-sampling and over-temperature-malfunction signal feedback /F_IGBT_OT. The short-circuit signal /F_SHORT and the PWM enabling signal /PWM_EN_CB are from the control board of the electric-motor controller.

The function safety circuit, according to the different inputted malfunctions and the instruction signals from the control board, controls the PWM pulse by controlling the PWM buffer circuit, to realize the operations of the three-phase bridge IGBT module such as full opening of the three upper switching tubes, full opening of the three lower switching tubes, complete shutting off of the IGBT tubes and normal ON/OFF of the IGBT tubes.

The control board of the electric-motor controller may, by using the PWM_EN_CB signal, cause the PWM buffer circuit to or not to output the PWM signal. The actively short-circuiting signal /F_SHORT of the control board may realize the function of the short circuit of the electric motor according to the control strategies, for example: when the back electromotive force of the electric motor is too high, which results in the generation of the bus-voltage-overvoltage signal /F_HV_OV, the function safety circuit, by short-circuiting the lower bridge arm of the IGBT module, eliminates the back electromotive force of the electric motor to protect the electric-motor controller; when the isolating driving optical coupler has detected a short trouble of the upper bridge arm or a driving undervoltage malfunction of the upper bridge arm of the IGBT module, the function safety circuit, by short-circuiting the lower bridge arm of the IGBT module, protects the IGBT module; when the isolating driving optical coupler has detected a short trouble of the lower bridge arm or a driving undervoltage malfunction of the lower bridge arm of the IGBT module, the function safety circuit, by short-circuiting the upper bridge arm of the IGBT module, protects the IGBT module; when the +15V undervoltage signal /F_GD_15V of the output voltage of the Sepic power supply on the driver board has been generated, the function safety circuit, by shutting off all of the IGBT tubes, protects the IGBT module; and when the IGBT over-temperature-malfunction signal /F_IGBT_OT has been generated, the function safety circuit, by shutting off all of the IGBT tubes, protects the IGBT module.

Accordingly, it can be known that the driver board, which integrates the IGBT driving circuit, has the advantages of small occupation of the overall space, complete IGBT protection and quick action. The complete IGBT protection means that it provides functions of protection from many aspects, including, for example: driving-power-supply secondary-undervoltage protection: /F_UVLO_TOP/BOT, driving-voltage primary-undervoltage protection: /F_GD_15V, IGBT short-circuit protection: /F_DST_TOP/BOT, bus-voltage overvoltage protection: /F_HV_OV, and IGBT over-temperature protection: /F_IGBT_OT.

The IGBT driving circuit of an the electric-motor controller based on function safety according to the present disclosure comprises the Sepic power supply, the high-frequency isolating transformer, the isolating driving optical coupler with a flyback controller, the push-pull amplifier circuit, the malfunction signal collection, the function safety circuit and the PWM buffer circuit. The Sepic power supply supplies power to the low-voltage side of the driver board. The isolating transformer, the isolating driving optical coupler with a flyback controller and the push-pull amplifier circuit are used for operations such as the isolating of the driving power supply, the amplification of the driving signals and the feeding back of the detection signals. Malfunction signal collection is used to collect the IGBT temperature and the bus voltage. The function safety circuit is used to collect and perform logical processing to the malfunction signals, and it outputs the signals to control the PWM buffer circuit to complete the multiple functions of protection to the IGBT module and the electric-motor controller, to provide complete protection to the IGBT, and has quick action and quick response.

Figure 3:
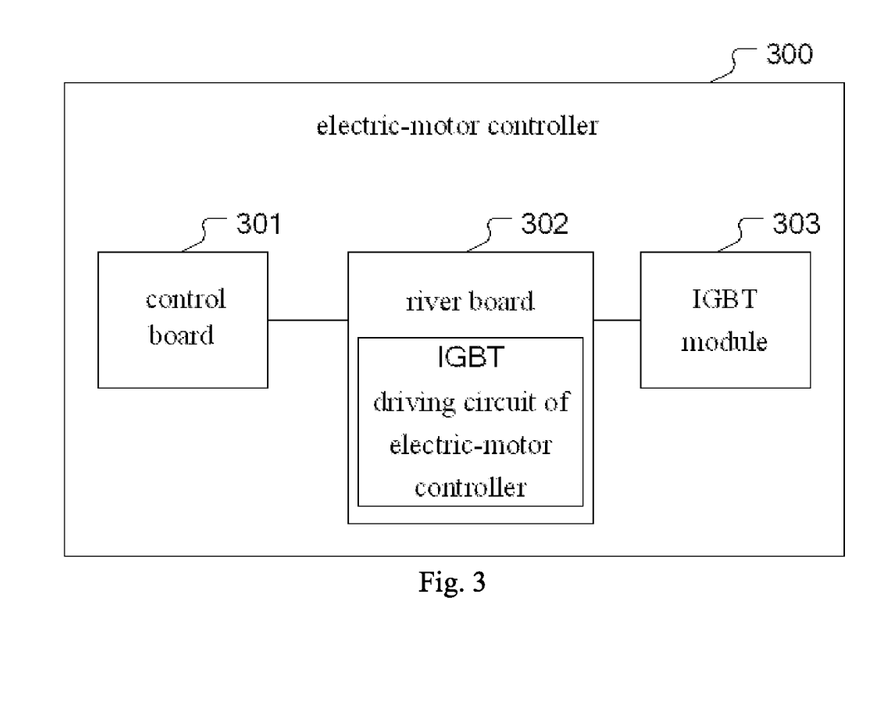
FIG. 3 is a block diagram of the electric-motor controller of an embodiment of the present disclosure.

FIG. 3 is a block diagram of the electric-motor controller of an embodiment of the present disclosure. Referring to FIG. 3, the electric-motor controller 300 of the present embodiment comprises: a control board 301, a driver board 302 and an IGBT module 303. The driver board is provided with the IGBT driving circuit of an electric-motor controller of the above embodiments, and the driving circuit can quickly ensure the safety of the electric-motor controller when it is detected that the IGBT module is having a malfunction, to improve the overall usability and safety of the electric-motor controller.

The above are merely particular embodiments of the present disclosure. By the teaching of the present disclosure, a person skilled in the art can make other modifications or variations on the basis of the above embodiments. A person skilled in the art should understand that the above particular descriptions are only for the purpose of better interpreting the present disclosure, and the protection scope of the present disclosure should be subject to the protection scope of the claims.

What is claimed is:

1. An IGBT driving circuit for an electric-motor controller, wherein the IGBT driving circuit comprises: a function safety circuit provided on a driver board of the electric-motor controller, and a detection feedback circuit and a pulse-width-modulation (PWM) buffer circuit that are connected to the function safety circuit;
   the detection feedback circuit is configured to detect fault and malfunction of an IGBT module of the electric-motor controller, and when a specified fault or malfunction of the IGBT module is detected, send a specified-malfunction signal to the function safety circuit;
   the function safety circuit is configured to judge according to a preset malfunction treating rule and the received specified-malfunction signal, and then output a corresponding controlling signal to the PWM buffer circuit; and
   the PWM buffer circuit is configured to generate according to the corresponding controlling signal a PWM signal that drives the IGBT module, to control ON/OFF of the IGBT module to protect the IGBT module,
   the IGBT driving circuit further comprises: an isolating driving power-supply circuit; and
   the isolating driving power-supply circuit is configured to receive the PWM signal outputted by the PWM buffer circuit, and isolate the PWM signal,
   the isolating driving power-supply circuit comprises: an isolating transformer and an isolating driving optical coupler;
   the isolating transformer has an input end connected to a power supply of the driver board of the electric-motor controller, and an output end connected to the isolating driving optical coupler;
   the isolating driving optical coupler has an input end connected to the PWM buffer circuit, and an output end connected to the IGBT module, and is configured to isolate the PWM signal and output the PWM signal to the IGBT module; and
   the isolating driving optical coupler is further configured to detect a voltage between an emitter and a collector of the IGBT module, and when it is detected that the IGBT module is having a short trouble or a driving-voltage-undervoltage malfunction, feed back a short-trouble signal or a driving-voltage-undervoltage-malfunction signal to the function safety circuit.

2. The IGBT driving circuit for an electric-motor controller according to claim 1, wherein the detection feedback circuit comprises: a temperature detection feedback circuit, a bus-voltage detection feedback circuit and a power-supply-voltage detection feedback circuit;
   the temperature detection feedback circuit is configured to detect a temperature value of the IGBT module, and when the temperature value exceeds a preset temperature threshold, determine that the IGBT module is having an over-temperature malfunction and feed back an over-temperature-malfunction signal to the function safety circuit, to cause the function safety circuit to control to shut off the IGBT module;
   the bus-voltage detection feedback circuit is configured to detect a bus-voltage value of the IGBT module, and when it is determined that a bus-voltage-overvoltage malfunction happens, feed back a bus-voltage-overvoltage-malfunction signal to the function safety circuit, to cause the function safety circuit to control to shut off the IGBT module; and
   the power-supply-voltage detection feedback circuit is configured to detect a voltage value of a power supply of the driver board of the electric-motor controller, and when it is determined that a power-supply-voltage-undervoltage malfunction happens, feed back a power-supply-voltage-undervoltage-malfunction signal to the function safety circuit, to cause the function safety circuit to control to shut off the IGBT module.

3. An electric-motor controller, wherein the electric-motor controller comprises the IGBT driving circuit according to claim 2.

4. The IGBT driving circuit for an electric-motor controller according to claim 1, wherein the function safety circuit is configured to receive an actively short-circuiting signal from a control board of the electric-motor controller, and control according to the actively short-circuiting signal the PWM buffer circuit to generate a PWM signal, to control to shut off the IGBT module.

5. An electric-motor controller, wherein the electric-motor controller comprises the IGBT driving circuit according to claim 4.

6. The IGBT driving circuit for an electric-motor controller according to claim 1, wherein the function safety circuit is configured to receive a PWM enabling signal from a control board of the electric-motor controller, and according to the PWM enabling signal, cause the PWM buffer circuit to or not to output a PWM signal.

7. An electric-motor controller, wherein the electric-motor controller comprises the IGBT driving circuit according to claim 6.

8. The IGBT driving circuit for an electric-motor controller according to claim 1, wherein
   the IGBT driving circuit further comprises: a redundant buffer circuit; and
   the redundant buffer circuit is configured to receive malfunction signals that are generated when the IGBT module is having malfunctions, buffer the received one or more malfunctions, and then send them to a control board of the electric-motor controller, for the control board of the electric-motor controller to make judgement.

9. An electric-motor controller, wherein the electric-motor controller comprises the IGBT driving circuit according to claim 8.

10. The IGBT driving circuit for an electric-motor controller according to claim 1, wherein
    the IGBT driving circuit further comprises: a push-pull amplifier circuit; and
    the push-pull amplifier circuit is connected to the isolating driving power-supply circuit and the IGBT module, and is configured to amplify the received PWM signal and output it to the IGBT module.

11. An electric-motor controller, wherein the electric-motor controller comprises the IGBT driving circuit according to claim 10.

12. The IGBT driving circuit for an electric-motor controller according to claim 1, wherein
    the isolating driving optical coupler has a flyback controller; and
    the power supply of the driver board of the electric-motor controller is a Sepic power supply that outputs a 15V voltage.

13. An electric-motor controller, wherein the electric-motor controller comprises the IGBT driving circuit according to claim 12.

14. An electric-motor controller, wherein the electric-motor controller comprises the IGBT driving circuit according to claim 1.

* * * * *